United States Patent
Wada et al.

(10) Patent No.: US 12,342,632 B2
(45) Date of Patent: Jun. 24, 2025

(54) SOLAR CELL, MULTI-JUNCTION TYPE SOLAR CELL, SOLAR CELL MODULE, AND SOLAR CELL POWER GENERATION SYSTEM

(71) Applicants: KABUSHIKI KAISHA TOSHIBA, Tokyo (JP); TOSHIBA ENERGY SYSTEMS & SOLUTIONS CORPORATION, Kanagawa (JP)

(72) Inventors: Atsushi Wada, Kanagawa (JP); Sara Yoshio, Kanagawa (JP); Soichiro Shibasaki, Tokyo (JP); Yuya Honishi, Saitama (JP); Naoyuki Nakagawa, Tokyo (JP); Yukitami Mizuno, Tokyo (JP); Mutsuki Yamazaki, Kanagawa (JP); Yasutaka Nishida, Tokyo (JP); Kazushige Yamamoto, Kanagawa (JP)

(73) Assignees: KABUSHIKI KAISHA TOSHIBA, Tokyo (JP); TOSHIBA ENERGY SYSTEMS & SOLUTIONS CORPORATION, Kawasaki (JP)

( * ) Notice: Subject to any disclaimer, the term of this patent is extended or adjusted under 35 U.S.C. 154(b) by 0 days.

(21) Appl. No.: 18/448,194

(22) Filed: Aug. 11, 2023

(65) Prior Publication Data
US 2023/0387338 A1     Nov. 30, 2023

Related U.S. Application Data

(63) Continuation of application No. PCT/JP2021/041106, filed on Nov. 9, 2021.

(51) Int. Cl.
*H10F 19/35* (2025.01)
*H10F 10/161* (2025.01)

(52) U.S. Cl.
CPC ........... *H10F 19/35* (2025.01); *H10F 10/161* (2025.01)

(58) Field of Classification Search
CPC ......... H01L 31/022466; H01L 31/0465; H01L 31/0725; H01L 31/078; H10F 10/161; H10F 10/19; H10F 19/35; H10F 77/244
See application file for complete search history.

(56) References Cited

U.S. PATENT DOCUMENTS

| 2002/0066478 A1 | 6/2002 | Hayashi et al. |
| 2008/0035199 A1* | 2/2008 | Kume ................. H01L 31/0322 257/E31.027 |

(Continued)

FOREIGN PATENT DOCUMENTS

| JP | 2002-261313 | 9/2002 |
| JP | 2006-202919 | 8/2006 |

(Continued)

OTHER PUBLICATIONS

International Search Report and Written Opinion for International Application No. PCT/JP2021/041106 mailed on Jan. 11, 2022, 10 pgs.

(Continued)

*Primary Examiner* — Golam Mowla
(74) *Attorney, Agent, or Firm* — Amin, Turocy & Watson, LLP (57) ABSTRACT

According to one embodiment, a solar cell includes first and second conductive layers, first and second counter conductive layers, first and second photoelectric conversion layers, first and second compound layers. The first counter conductive layer includes a first conductive region. A direction from the first conductive layer to the first conductive region is along a first direction. The first compound layer includes a first compound region provided between the first photoelectric conversion layer and the first conductive region. A (Continued)

second direction from the first conductive layer to the second conductive layer crosses the first direction. The second counter conductive layer includes a second conductive region electrically connected with the first conductive layer. A direction from the second conductive layer to the second conductive region is along the first direction. A direction from the first conductive region to the second conductive region is along the second direction.

12 Claims, 6 Drawing Sheets

(56) References Cited

U.S. PATENT DOCUMENTS

| | | | | |
|---|---|---|---|---|
| 2009/0084425 | A1* | 4/2009 | Milshtein | H10F 19/33 |
| | | | | 438/73 |
| 2009/0165840 | A1* | 7/2009 | Murata | H10F 19/35 |
| | | | | 257/E31.043 |
| 2011/0017271 | A1* | 1/2011 | Tsai | H10F 19/35 |
| | | | | 136/246 |
| 2014/0030843 | A1* | 1/2014 | Ahmed | H01L 31/0326 |
| | | | | 257/E31.004 |
| 2015/0255659 | A1* | 9/2015 | Huang | H10F 10/167 |
| | | | | 438/74 |
| 2020/0295209 | A1 | 9/2020 | Bush | |
| 2020/0303572 | A1 | 9/2020 | Zhao et al. | |
| 2021/0013360 | A1 | 1/2021 | Shibasaki et al. | |
| 2021/0020799 | A1 | 1/2021 | Verma et al. | |

FOREIGN PATENT DOCUMENTS

| | | |
|---|---|---|
| JP | 2012-182177 | 9/2012 |
| JP | 2014-060296 | 4/2014 |
| JP | 2020-508559 | 3/2020 |
| JP | 2021-506138 | 2/2021 |
| WO | 2020/175683 | 9/2020 |

OTHER PUBLICATIONS

Japanese Office Action for Japanese Patent Application No. 2023-559208 dated Dec. 2, 2024.

* cited by examiner

FIG. 10

SOLAR CELL, MULTI-JUNCTION TYPE SOLAR CELL, SOLAR CELL MODULE, AND SOLAR CELL POWER GENERATION SYSTEM

CROSS-REFERENCE TO RELATED APPLICATIONS

This is a continuation application of International Application PCT/JP2021/041106, filed on Nov. 9, 2021; the entire contents of which are incorporated herein by reference.

FIELD

The embodiments of the invention relate to a solar cell, a multi-junction type solar cell, a solar cell module, and a solar cell power generation system.

BACKGROUND

It is desired to improve efficiency in a solar cell.

DETAILED DESCRIPTION

According to one embodiment of the invention, a solar cell includes a first conductive layer, a first counter conductive layer, a first photoelectric conversion layer, a first compound layer, a second conductive layer, a second counter conductive layer, a second photoelectric conversion layer, and a second compound layer. The first counter conductive layer includes a first conductive region. A direction from the first conductive layer to the first conductive region is along a first direction. The first photoelectric conversion layer is provided between the first conductive layer and the first conductive region. The first compound layer includes a first compound region provided between the first photoelectric conversion layer and the first conductive region. A second direction from the first conductive layer to the second conductive layer crosses the first direction. The second counter conductive layer includes a second conductive region electrically connected with the first conductive layer. A direction from the second conductive layer to the second conductive region is along the first direction. A direction from the first conductive region to the second conductive region is along the second direction. The second photoelectric conversion layer is provided between the second conductive layer and the second conductive region. A direction from the first photoelectric conversion layer to the second photoelectric conversion layer is along the second direction. The second compound layer includes a second compound region and a third compound region. The second compound region is provided between the second photoelectric conversion layer and the second conductive region. At least a part of the third compound region is between the first conductive layer and the second conductive layer.

Various embodiments of the invention are described below with reference to the accompanying drawings.

The drawings are schematic and conceptual; and the relationships between the thickness and width of portions, the proportions of sizes among portions, etc., are not necessarily the same as the actual values. The dimensions and proportions may be illustrated differently among drawings, even for identical portions.

In the specification and drawings, components similar to those described previously or illustrated in an antecedent drawing are marked with like reference numerals, and a detailed description is omitted as appropriate.

First Embodiment

Figure 1:
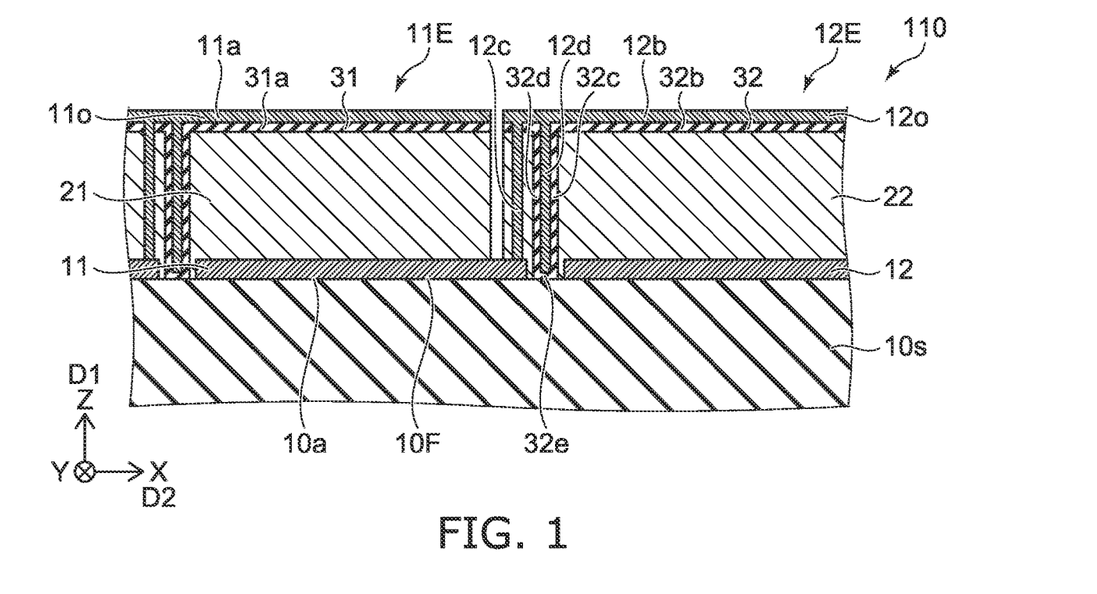
FIG. 1 is a schematic cross sectional view illustrating a solar cell according to a first embodiment.

FIG. 1 is a schematic cross sectional view illustrating a solar cell according to a first embodiment.

As shown in FIG. 1, a solar cell 110 according to the embodiment includes a first conductive layer 11, a first counter conductive layer 110, a first photoelectric conversion layer 21, a first compound layer 31, a second conductive layer 12, a second counter conductive layer 12o, a second photoelectric conversion layer 22, and a second compound layer 32.

The first counter conductive layer 110 includes a first conductive region 11a. A direction from the first conductive layer 11 to the first conductive region 11a is along a first direction.

The first direction D1 is defined as a Z-axis direction. One direction perpendicular to the Z-axis direction is defined as an X-axis direction. A direction perpendicular to the Z-axis direction and the X-axis direction is defined as a Y-axis direction.

The first photoelectric conversion layer 21 is provided between the first conductive layer 11 and the first conductive region 11a.

The first compound layer 31 includes a first compound region 31a. The first compound region 31a is provided between the first photoelectric conversion layer 21 and the first conductive region 11a.

A second direction D2 from the first conductive layer 11 to the second conductive layer 12 crosses the first direction D1. The second direction D2 is, for example, the X-axis direction.

The second counter conductive layer 12o includes a second conductive region 12b. The second conductive region 12b is electrically connected with the first conductive layer 11. In this example, the second counter conductive layer 12o includes a third conductive region 12c. The third conductive region 12c electrically connects the first conductive layer 11 and the second conductive region 12b. The third conductive region 12c is continuous with the second conductive region 12b. The boundary between the third conductive region 12c and the second conductive region 12b may be clear or unclear.

A direction from the second conductive layer 12 to the second conductive region 12b is along the first direction D1. A direction from the first conductive region 11a to the second conductive region 12b is along the second direction D2.

The second photoelectric conversion layer 22 is provided between the second conductive layer 12 and the second conductive region 12b. A direction from the first photoelectric conversion layer 21 to the second photoelectric conversion layer 22 is along the second direction D2.

The second compound layer 32 includes a second compound region 32b and a third compound region 32c. The second compound region 32b is provided between the second photoelectric conversion layer 22 and the second conductive region 12b. At least a part of the third compound region 32c is between the first conductive layer 11 and the second conductive layer 12.

For example, light is incident on the first photoelectric conversion layer 21 via either the first conductive layer 11 or the first counter conductive layer 110. The electric charge generated in the first photoelectric conversion layer 21 is taken out as an electric current. For example, light is incident on the second photoelectric conversion layer 22 via either the second conductive layer 12 or the second counter conductive layer 12o. The electric charge generated in the second photoelectric conversion layer 22 is taken out as an electric current. The first conductive layer 11, the first counter conductive layer 110, the second conductive layer 12, and the second counter conductive layer 12o function as electrodes, for example. The first photoelectric conversion layer 21 and the second photoelectric conversion layer 22 are light absorption layers. At least one of the first conductive layer 11 or the first counter conductive layer 110 is light transmissive. At least one of the second conductive layer 12 or the second counter conductive layer 12o is light transmissive.

In the embodiment, the provision of the first compound region 31a of the first compound layer 31 and the second compound region 32b of the second compound layer 32 makes it easier to take out the electric charge. Higher efficiency is obtained. For example, the conductivity of these compound layers is lower than that of the photoelectric conversion layer. The resistivity of these compound layers is higher than that of the photoelectric conversion layer.

The first conductive layer 11, the first counter conductive layer 110, and the first photoelectric conversion layer 21 are included in a first cell 11E. The second conductive layer 12, the second counter conductive layer 12o, and the second photoelectric conversion layer 22 are included in a second cell 12E. In the embodiment, the first conductive layer 11 is electrically connected with the second counter conductive layer 12o. The first cell 11E is connected in series with the second cell 12E. As a result, for example, the target voltage can be obtained.

In the first cell 11E and the second cell 12E connected in series with each other, the first conductive layer 11 and the second conductive layer 12 are separated.

A first reference example in which the same material as the photoelectric conversion layer is provided in the space between the first conductive layer 11 and the second conductive layer 12 can be considered. In the manufacture of the solar cell of the first reference example, a photoelectric conversion film is formed so as to cover the first conductive layer 11 and the second conductive layer 12 which are separated from each other. After that, the photoelectric conversion film is separated to produce the solar cell of the first reference example. This makes it relatively easy to manufacture a solar cell.

In such a first reference example, the same material as the photoelectric conversion layer is provided in the space between the first conductive layer 11 and the second conductive layer 12. The conductivity of the material of the photoelectric conversion layer is relatively high. Therefore, in the first reference example, a leakage current is likely to occur between the first conductive layer 11 and the second conductive layer 12. As a result, the improvement in efficiency is insufficient.

In the embodiment, at least a part of the third compound region 32c of the second compound layer 32 is provided between the first conductive layer 11 and the second conductive layer 12. As a result, the leakage current between the first conductive layer 11 and the second conductive layer 12 can be suppressed. According to the embodiment, a solar cell capable of improving efficiency can be provided. In embodiments, the third compound region 32c functions as an electrical separation layer.

In the first reference example, a leakage current is likely to occur also between the conductive member (for example, the third conductive region 12c) connecting multiple cells in series and the second conductive layer 12.

As shown in FIG. 1, in the embodiment, a part of the third compound region 32c is provided between the third conductive region 12c and the second conductive layer 12. As a result, the leakage current between the third conductive region 12c and the second conductive layer 12 can also be suppressed. As a result, even higher efficiency can be obtained.

In the embodiment, the third compound region 32c, which functions as an electrical separation layer, is continuous with the second compound region 32b. For example, the material of the third compound region 32c is the same as the material of the second compound region 32b. Electrical separation is performed by the third compound region 32c of the material of the second compound region 32b. As a result, the leakage current can be suppressed by a simple manufacturing process.

For example, a second reference example in which another insulating member is provided between the first conductive layer 11 and the second conductive layer 12 can be considered. In the second reference example, the leakage current between the first conductive layer 11 and the second conductive layer 12 can be suppressed. However, in the second reference example, another insulating member is used, which complicates the manufacturing process. In the second reference example, the practicality is low.

In the embodiment, the leakage current can be suppressed while maintaining a simple manufacturing process. High efficiency is obtained while maintaining a simple manufacturing process.

In the embodiment, for example, at least one of the first photoelectric conversion layer 21 or the second photoelectric conversion layer 22 includes copper and oxygen. For example, at least one of the first photoelectric conversion layer 21 or the second photoelectric conversion layer 22 includes $Cu_2O$. For example, at least one of the first photoelectric conversion layer 21 or the second photoelectric conversion layer 22 includes a crystal including $Cu_2O$. By using such a material, high photoelectric conversion efficiency can be easily obtained. In such a material, the resistivity of the photoelectric conversion layer is relatively low. When such a material is used, the above-mentioned leakage current is likely to occur. When the photoelectric conversion layer of such a material is used, the leakage current can be effectively suppressed by providing the above-mentioned third compound region 32c.

In the embodiment, for example, the conductivity of the first compound layer 31 is lower than the conductivity of the first photoelectric conversion layer 21. For example, the conductivity of the second compound layer 32 is lower than the conductivity of the second photoelectric conversion layer 22. For example, the resistivity of the first compound layer 31 is higher than the resistivity of the first photoelectric conversion layer 21. For example, the resistivity of the second compound layer 32 is higher than the resistivity of the second photoelectric conversion layer 22. Due to the third compound region 32c of the second compound layer 32, electrical insulation can be easily obtained.

At least one of the first compound layer 31 or the second compound layer 32 includes, for example, at least one of an oxide or a sulfide. This oxide includes, for example, at least one selected from the group consisting of Ga, Al, B, In, Ti, Zn, Hf, Zr, Sn, Si and Ge. At least one of the first compound layer 31 or the second compound layer 32 includes, for example, at least one selected from the group consisting of $Ga_2O_3$, $Ga_2O_3$ including Al (for example, GaAlO), $Ga_2O_3$ including Sn (for example, GaSnO), ZnO, and ZnO including Sn (for example, ZnSnO). For example, the first compound region 31a and the second compound region 32b make it easy to obtain high charge extraction efficiency. For example, in the third compound region 32c, high insulating properties can be easily obtained.

In the embodiment, at least one of the first compound layer 31 or the second compound layer 32 is n-type.

As shown in FIG. 1, the solar cell 110 may further include a base body 10s. The base body 10s includes a first surface 10F. The first surface 10F includes a first base body region 10a and a second base body region 10b. The first conductive layer 11 faces the first base body region 10a. The first conductive layer 11 is between the first base body region 10a and the first conductive region 11a in the first direction D1. The second conductive layer 12 faces the second base body region 10b. The second conductive layer 12 is between the second base body region 10b and the second conductive region 12b in the first direction D1.

The base body 10s, the first conductive layer 11, the first conductive region 11a, the first photoelectric conversion layer 21, the first compound region 31a, the second conductive layer 12, the second conductive region 12b, the second photoelectric conversion layer 22, the second compound region 32b are layered extending along the X-Y plane.

As shown in FIG. 1, the second counter conductive layer 12o may further include a fourth conductive region 12d. The second compound layer 32 may include a fourth compound region 32d. The third compound region 32c is between the fourth conductive region 12d and a part of the second photoelectric conversion layer 22. The third compound region 32c can also be in contact with the base body 10s. The fourth compound region 32d is between the fourth conductive region 12d and another part of the second photoelectric conversion layer 22. For example, the fourth conductive region 12d is between the fourth compound region 32d and the third compound region 32c in the second direction D2. The second compound layer 32 may include a fifth compound region 32e. At least a part of the fifth compound region 32e is between the base body 10s and the fourth conductive region 12d. The fifth compound region 32e is in contact with the base body 10s. In this example, the third compound region 32c and the fourth compound region 32d are connected by the fifth compound region 32e.

As shown in FIG. 1, for example, at least a part of the fourth compound region 32d may be provided between the first conductive layer 11 and the second conductive layer 12. Electrical separation is effective.

As shown in FIG. 1, at least a part of the fourth conductive region 12d may be provided between the first conductive layer 11 and the second conductive layer 12. There is a part of the fourth compound region 32d between the first conductive layer 11 and a part of the fourth conductive region 12d. There is a part of the third compound region 32c between the part of the fourth conductive region 12d and the second conductive layer 12. With such a configuration, electrical separation is stably performed.

As shown in FIG. 1, at least a part of the third conductive region 12c is between the first photoelectric conversion layer 21 and the second photoelectric conversion layer 22 in the second direction D2. Multiple cells are connected in series by the third conductive region 12c.

As described above, in the solar cell 110, the leakage current is suppressed by providing the third compound region 32c between the first conductive layer 11 and the second conductive layer 12. In the solar cell 110, the fourth conductive region 12d may be omitted. In the solar cell 110, the fourth compound region 32d may be omitted. The number of the multiple cells included in the solar cell 110 is 2 or more, and is arbitrary.

As described above, the third compound region 32c may be provided between the first conductive layer 11 and the second conductive layer 12. The third compound region 32c may be in contact with the base body 10s or may be separated from the base body 10s. The third compound region 32c may be in contact with the first conductive layer 11 or may be separated from the first conductive layer 11. The third compound region 32c may be in contact with the second conductive layer 12 or may be separated from the second conductive layer 12.

Figure 2:
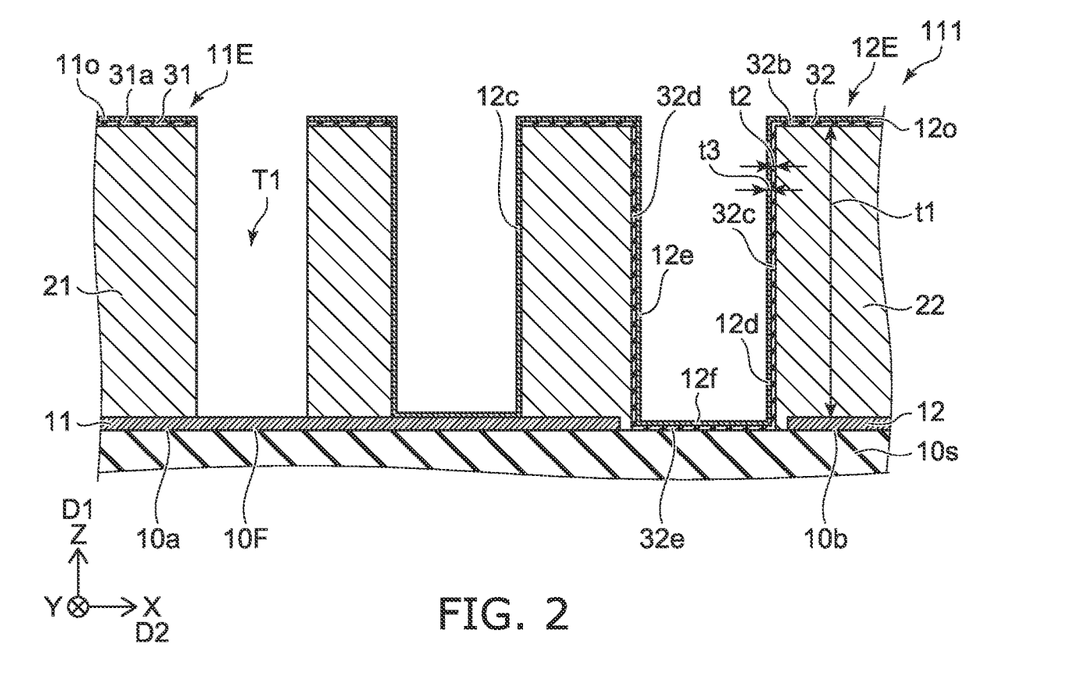
FIG. 2 is a schematic cross sectional view illustrating a solar cell according to the first embodiment.

FIG. 2 is a schematic cross sectional view illustrating a solar cell according to the first embodiment.

FIG. 2 enlarges and illustrates the area including the connection portion of the first cell 11E and the second cell 12E. As shown in FIG. 2, also in a solar cell 111 according to the embodiment, the first conductive layer 11, the first counter conductive layer 11o, the first photoelectric conversion layer 21, the first compound layer 31, the second conductive layer 12, the second counter conductive layer 12o, the second photoelectric conversion layer 22, and the second compound layer 32 are provided. In the solar cell 111, the second counter conductive layer 12o includes the fourth conductive region 12d and a fifth conductive region 12e. Other configurations of the solar cell 111 may be the same as the configuration of the solar cell 110.

The fifth conductive region 12e is between the fourth compound region 32d and the fourth conductive region 12d in the second direction D2. A direction from the fifth conductive region 12e to the fourth conductive region 12d is along the second direction D2.

In this example, the second counter conductive layer 120 further includes a sixth conductive region 12f. The sixth conductive region 12f electrically connects the fifth conductive region 12e with the fourth conductive region 12d. The fifth compound region 32e is provided between the third compound region 32c and the fourth compound region 32d.

Such a configuration may be formed as follows. For example, the second photoelectric conversion layer 22 is provided with a groove. A compound film to be the second compound layer 32 is formed inside the groove. A conductive film to be the second counter conductive layer 12o is formed on the conductive film. This gives the above configuration.

The conductive film to be the second counter conductive layer 12o is electrically connected with the first conductive layer 11. A groove T1 is provided between the first cell 11E and the second cell 12E. The groove T1 separates the first photoelectric conversion layer 21 and the second photoelectric conversion layer 22. The first conductive layer 11 extends from a side of the first cell 11E toward the second cell 12E. The third conductive region 12c is electrically connected with the extending portion.

As shown in FIG. 2, a length (thickness) of the second photoelectric conversion layer 22 in the first direction D1 is defined as a length t1. A length (thickness) of the third compound region 32c in the second direction D2 is defined as a length t2. The length t2 is shorter than the length t1.

A length (thickness) of the fourth conductive region 12d in the second direction D2 is defined as a length t3. The length t3 is shorter than the length t1 (the length of the second photoelectric conversion layer 22 in the first direction D1). With such a configuration, for example, the region for electrical insulation can be narrowed. This increases the area for photoelectric conversion. High efficiency is easy to obtain.

In the embodiment, the length t1 (thickness) is, for example, not less than 100 nm and not more than 200 μm. The length t2 (thickness) is, for example, not less than 5 nm and not more than 100 nm. The length t3 (thickness) is, for example, not less than 30 nm and not more than 1 μm.

Hereinafter, an example will be described in a method for manufacturing the solar cell 111.

FIG. 3A to FIG. 3H are schematic cross sectional views illustrating a manufacturing method of the solar cell according to the first embodiment.

Figure 3A:
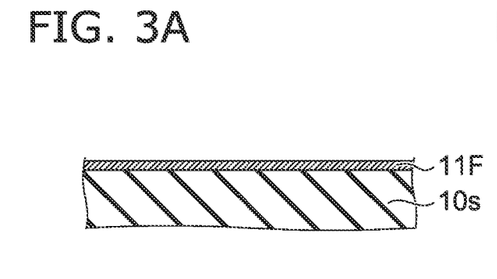
FIG. 3A to FIG. 3H are schematic cross sectional views illustrating a manufacturing method of the solar cell according to the first embodiment.

As shown in FIG. 3A, a conductive film 11F is provided on the base body 10s.

Figure 3B:
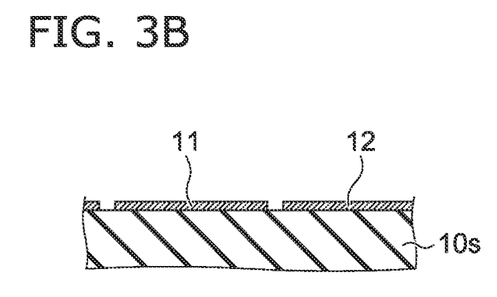

As shown in FIG. 3B, a part of the conductive film 11F is removed. As a result, the first conductive layer 11 and the second conductive layer 12 are obtained. Partial removal of the conductive film 11F is performed, for example, by at least one of etching process or scribe processing.

Figure 3C:
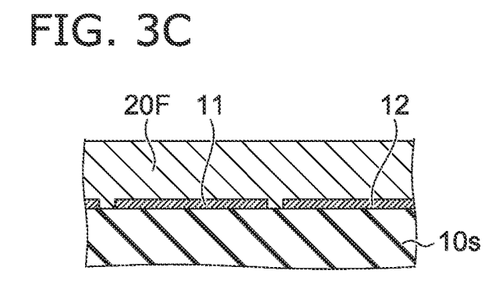

As shown in FIG. 3C, a photoelectric conversion film 20F is provided on the base body 10s, the first conductive layer 11 and the second conductive layer 12. The photoelectric conversion film is formed by, for example, sputtering.

Figure 3D:
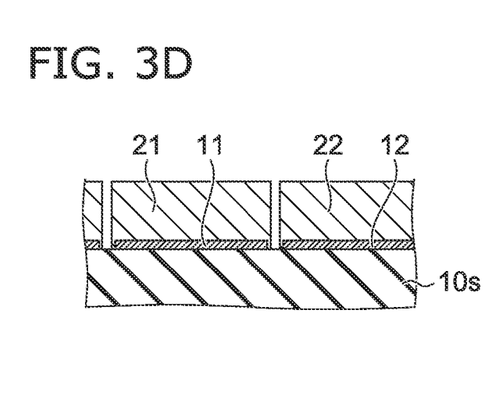

As shown in FIG. 3D, a part of the photoelectric conversion film 20F is removed. As a result, the first photoelectric conversion layer 21 and the second photoelectric conversion layer 22 are obtained. The part of the photoelectric conversion film 20F is removed by, for example, scribe processing.

Figure 3E:
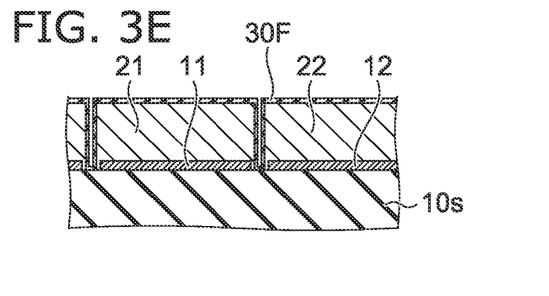

As shown in FIG. 3E, a compound film 30F is formed on the first photoelectric conversion layer 21 and the second photoelectric conversion layer 22. The compound film 30F is also formed on the side surface of the first photoelectric conversion layer 21 and the side surface of the second photoelectric conversion layer 22. The compound film 30F can be formed, for example, by vapor deposition or atomic layer deposition.

Figure 3F:
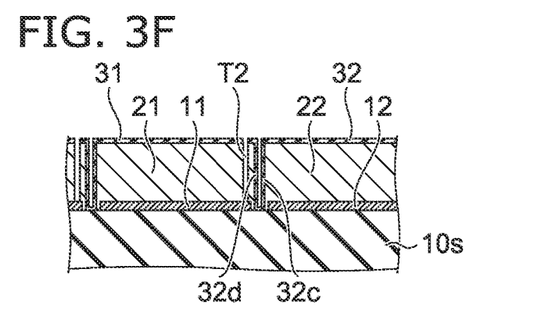

As shown in FIG. 3F, a groove T2 is formed. The groove T2 separates the compound film 30F. As a result, the first compound layer 31 and the second compound layer 32 are obtained from the compound film 30F. The third compound region 32c and the fourth compound region 32d of the second compound layer 32 are obtained. The groove T2 is formed, for example, by scribe processing or the like.

Figure 3G:
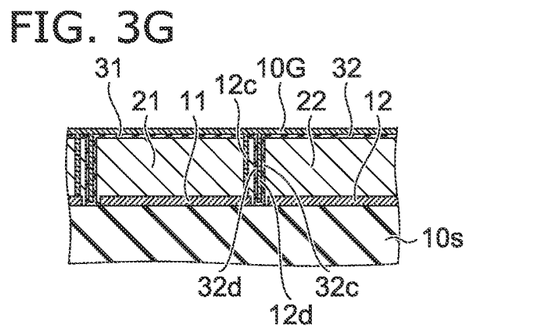

As shown in FIG. 3G, a conductive film 10G is formed on the processed body. The conductive film 10G is also formed inside the groove T2. As a result, the third conductive region 12c is formed. The conductive film 10G is also provided between the third compound region 32c and the fourth compound region 32d. As a result, the fourth conductive region 12d is formed. The conductive film 10G can be formed by, for example, vapor deposition or the like.

Figure 3H:
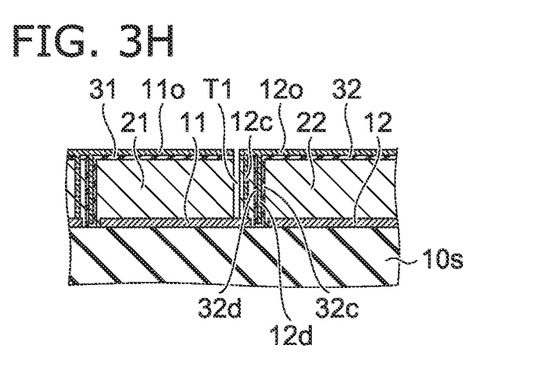

As shown in FIG. 3H, the groove T1 is formed. The conductive film 10G is divided by the groove T1. As a result, the first counter conductive layer 110 (first conductive region 11a) and the second counter conductive layer 12o (second conductive region 12b) are formed. The groove T1 can be formed by, for example, scribe processing or the like.

From the above, the solar cell 111 is obtained. In the process of FIG. 3D, the configuration may be obtained in which at least a part of the fourth conductive region 12d is not formed depending on the width of the groove between the first photoelectric conversion layer 21 and the second photoelectric conversion layer 22. The configuration may be obtained in which at least a part of the fifth conductive region 12e is not formed depending on the width of the groove between the first photoelectric conversion layer 21 and the second photoelectric conversion layer 22.

In the solar cell according to the embodiment, for example, the photoelectric conversion layer existing on the first conductive layer 11 is separated by the third conductive region 12c and the groove T1. Therefore, when the solar cell 111 is observed from a cross section, the photoelectric conversion layer existing on the first conductive layer 11 is divided into not less than two.

Hereinafter, an example of the characteristics of the solar cell 111 will be described.

Figure 4A:
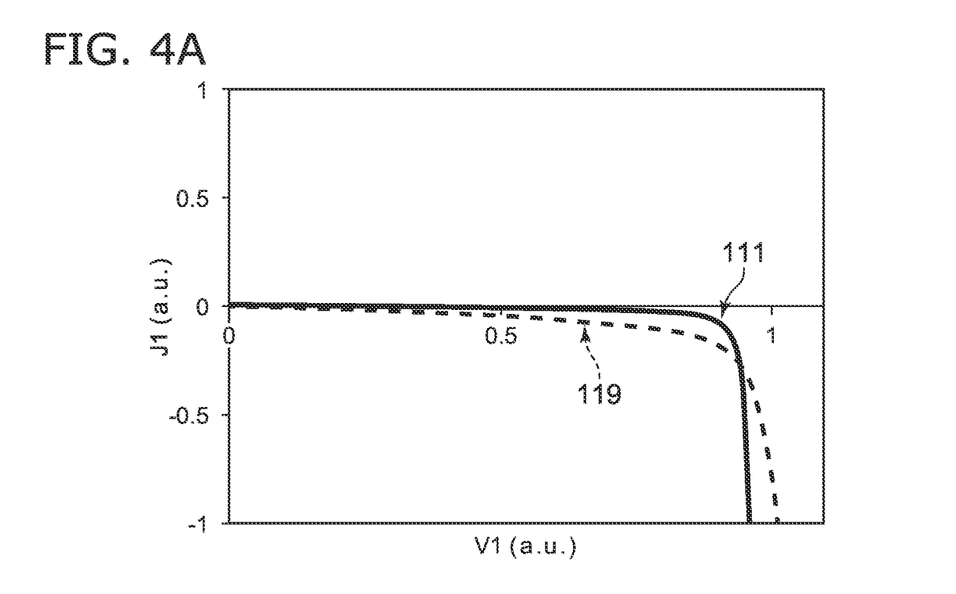
FIG. 4A and FIG. 4B are graphs illustrating characteristics of the solar cell according to the first embodiment.
Figure 4B:
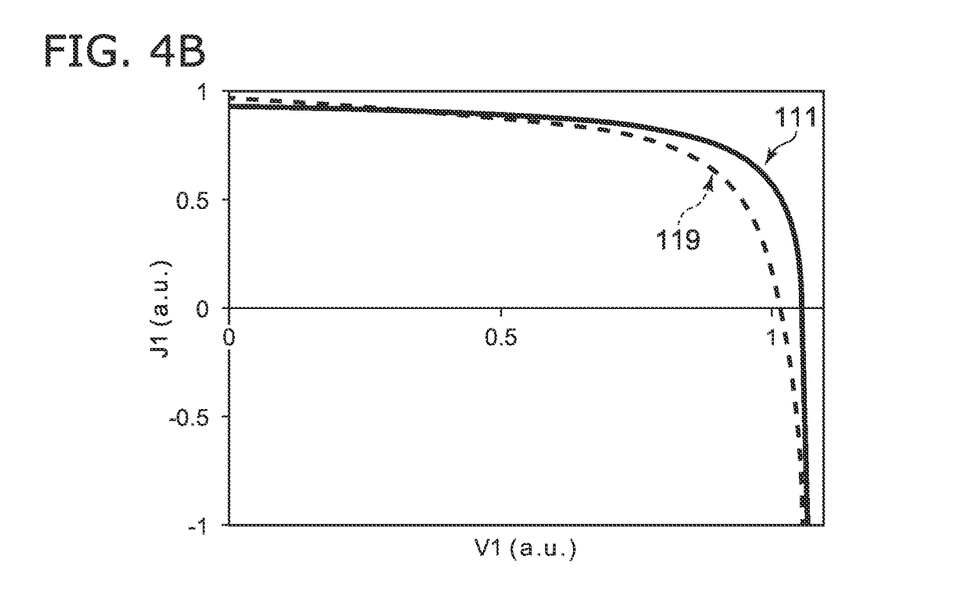

FIG. 4A and FIG. 4B are graphs illustrating the characteristics of the solar cell according to the first embodiment.

The horizontal axis of these figures is a voltage V1 (relative value) applied between two terminals of the configuration including the first cell 11E and the second cell 12E. One of the two terminals is electrically connected with, for example, the first counter conductive layer 110. Another one of the two terminals is, for example, electrically connected with the second conductive layer 12. The vertical axis of these figures is the obtained current density 31. FIG. 4A corresponds to a dark state. FIG. 4B corresponds to the characteristics when the solar cell is irradiated with light. The characteristics of light correspond to the characteristics of sunlight. In these figures, the characteristics of the solar cell 111 according to the embodiment and the characteristics of a solar cell 119 of the first reference example are shown. As described above, in the first reference example, the third compound region 32c is not provided, and only the same material as the photoelectric conversion layer 22 is provided between the first conductive layer 11 and the second conductive layer 12.

In the dark state shown in FIG. 4A, the current density 31 in the practical range where the voltage V1 is not more than 0.8 V is low in the solar cell 111. In the solar cell 119, the current density 31 in the practical range where the voltage V1 is not more than 0.8 V is high. In the solar cell 111 according to the embodiment, the leakage current is smaller than that of the solar cell 119 of the first reference example.

In the light irradiation state shown in FIG. 4B, the current density 31 in the practical range where the voltage V1 is not more than 0.8 V is high in the solar cell 111. In the solar cell 119, the current density 31 in the practical range where the voltage V1 is not more than 0.8 V is low. In the solar cell 111 according to the embodiment, a higher current density can be obtained as compared with the solar cell 119 of the first reference example.

The efficiency of the solar cell 111 is 1.13 times the efficiency of the solar cell 119. In the embodiment, high efficiency is obtained.

Figure 5:
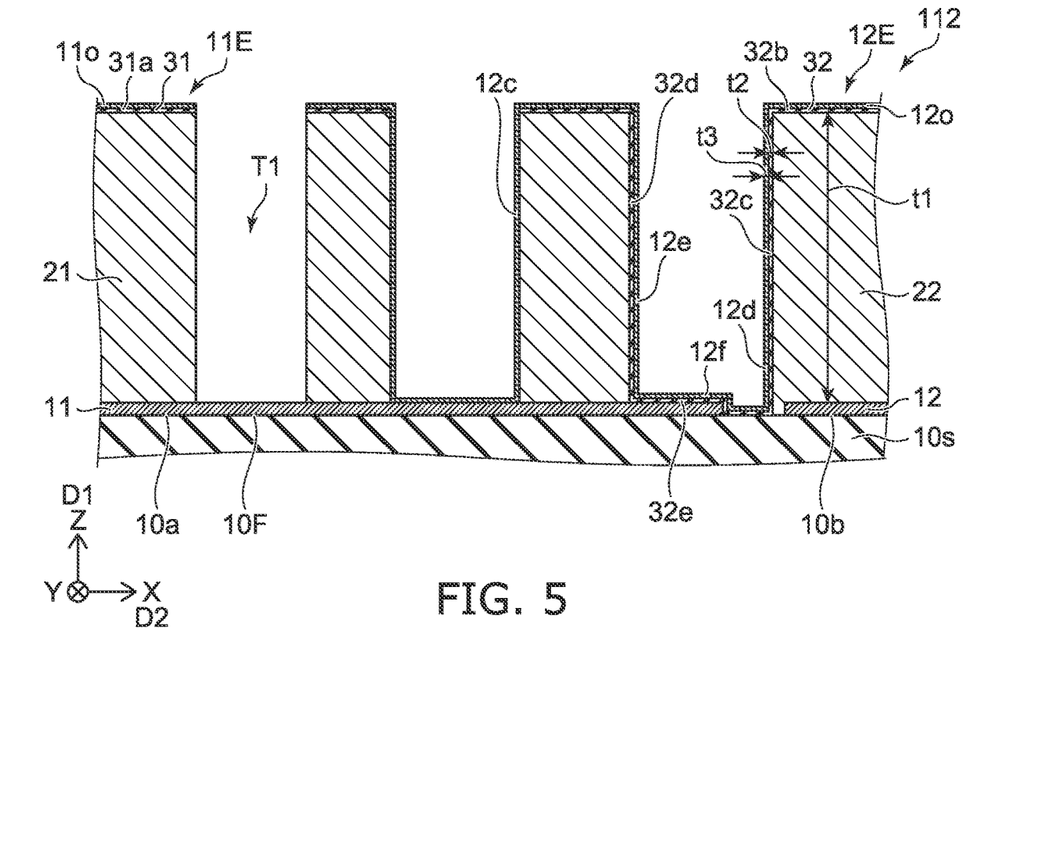
FIG. 5 is a schematic cross sectional view illustrating a solar cell according to the first embodiment.

FIG. 5 is a schematic cross sectional view illustrating a solar cell according to the first embodiment.

As shown in FIG. 5, also in the solar cell 112 according to the embodiment, the first conductive layer 11, the first counter conductive layer 110, the first photoelectric conversion layer 21, the first compound layer 31, the second conductive layer 12, and the second counter conductive layer 12o, the second photoelectric conversion layer 22 and the second compound layer 32 are provided. In the solar cell 112, a part of the first conductive layer 11 overlaps the fifth compound region 32e and the sixth conductive region 12f in the Z-axis direction. Other configurations of the solar cell 112 may be the same as the configuration of the solar cell 111.

In the solar cell 112, a part of the first conductive layer 11 is provided between the base body 10s and the fifth compound region 32e in the Z-axis direction. A part of the first conductive layer 11 is provided between the base body 10s and the sixth conductive region 12f in the Z-axis direction. A part of the fifth compound region 32e is provided between the first conductive layer 11 and the second conductive layer 12. A part of the sixth conductive region 12f may be provided between the first conductive layer 11 and the second conductive layer 12. A part of the third compound region 32c is provided between the first conductive layer 11 and the second conductive layer 12.

In the embodiment, at least one of the first photoelectric conversion layer 21 or the second photoelectric conversion layer 22 may include a first oxide. The first oxide includes, for example, at least one of cuprous oxide and a composite oxide of cuprous oxide. The first oxide is, for example, an oxide represented by $Cu_aM1_bO_c$. "M1" preferably includes, for example, at least one selected from the group consisting of Sn, Sb, Ag, Li, Na, K, Cs, Rb, Al, In, Zn, Mg and Ca. It is preferable that "a", "b" and "c" satisfy $1.80 \leq a \leq 2.01$, $0.00 \leq b \leq 0.20$, and $0.98 \leq c \leq 1.02$. A concentration of the first oxide in at least one of the first photoelectric conversion layer 21 or the second photoelectric conversion layer 22 is preferably not less than 90 wt %, for example. The concentration of the first oxide in at least one of the first photoelectric conversion layer 21 or the second photoelectric conversion layer 22 is more preferably not less than 95 wt %, for example. It is even more preferable that the concentration of the first oxide in the first photoelectric conversion layer 21 and the second photoelectric conversion layer 22 is, for example, not less than 98 wt %. It is preferable that at least one of the first photoelectric conversion layer 21 or the second photoelectric conversion layer 22 includes substantially no Cu or CuO. Cu or CuO is different phase.

In embodiments, at least one of the first compound layer 31 or the second compound layer 32 includes at least one of a second oxide or a sulfide. The second oxide preferably includes an oxide including at least one selected from the group consisting of Ga, Al, B, In, Ti, Zn, Hf, Zr, Sn, Si and Ge. For example, the photoelectric conversion layer may include the above-mentioned first oxide. In this case, for example, when the first compound layer 31 and the second compound layer 32 are formed, the above-mentioned second oxide is easy to extract oxygen bonded to Cu of the first oxide included in the photoelectric conversion layer.

In the embodiment, the sulfide included in at least one of the first compound layer 31 or the second compound layer 32 may include Cu diffused from the first oxide.

In the embodiment, when the first compound layer 31 and the second compound layer 32 include an oxide including Ga, a ratio of Ga to the metal element (total amount of the metal element) included in the oxide is preferably not less than 50 atom %.

The base body 10s may be, for example, a light-transmitting substrate. The base body 10s may include, for example, a substrate including an organic material. Examples of the organic material may include at least one selected from the group consisting of acrylic, polyimide, polycarbonate, polyethylene terephthalate (PET), polypropylene (PP), fluororesin (polytetrafluoroethylene: PTFE), perfluoroethylene propene copolymer (FEP), ethylene tetrafluoroethylene copolymer (ETFE), polychlorotrifluoroethylene (PCTFE), perfluoroalkoxy alkane (PFA, etc.), polyarylate, polysulfone, polyethersulfone, and polyetherimide. The base body 10s may include a substrate including an inorganic material. The inorganic material includes, for example, at least one selected from the group consisting of soda lime glass, white plate glass, chemically strengthened glass and quartz.

The base body 10s may include a layer including the above-mentioned organic material and a layer including the above-mentioned inorganic material. These layers are stacked. In the embodiment, the base body 10s may be omitted.

The first counter conductive layer 110 is light transmissive. The first counter conductive layer 110 preferably includes an oxide light-transmitting conductive film (semiconductor conductive film). The oxide light-transmitting conductive film includes at least one selected from the group consisting of, for example, Indium Tin Oxide (ITO), Aluminum-doped Zinc Oxide (AZO), Boron-doped Zinc Oxide (BZO), Gallium-doped Zinc Oxide (GZO), doped tin oxide, Titanium-doped Indium Oxide (ITiO), Indium Zinc Oxide (IZO), Indium Gallium Zinc Oxide (IGZO) and Hydrogen-doped Indium Oxide (IOH). The oxide light-transmitting conductive film may be a stacked film including multiple films.

The first conductive layer 11 may be, for example, light transmissive. The first conductive layer 11 is not light transmissive. The first conductive layer 11 may include a metal film. The metal film includes, for example, at least one selected from the group consisting of Au and Ag.

In the doped tin oxide, the dopant includes, for example, at least one selected from the group consisting of In, Si, Ge, Ti, Cu, Sb, Nb, Ta, W, Mo, F and Cl.

The first conductive layer 11 preferably incudes doped tin oxide. When the first conductive layer 11 includes the doped tin oxide, for example, it is preferable that the doped tin oxide is in direct contact with the photoelectric conversion layer. When the first conductive layer 11 includes a doped tin oxide film, it is preferable that the doped tin oxide film is provided on a surface of the first conductive layer 11 facing the photoelectric conversion layer side. It is preferable that the doped tin oxide film is in direct contact with the photoelectric conversion layer. The first conductive layer 11 preferably includes the doped tin oxide film including at least one selected from the group consisting of, for example, In, Si, Ge, Ti, Cu, Sb, Nb, Ta, W, Mo, F and Cl. In the doped tin oxide film, at least one concentration selected from the group consisting of In, Si, Ge, Ti, Cu, Sb, Nb, Ta, W, Mo, F and Cl is preferably not more than 10 atomic % with respect to tin included in the tin oxide film.

The first conductive layer 11 may include, for example, a stacked film including the oxide light-transmitting conductive film and the metal film. A thickness of the metal film is preferably not more than 10 nm. The metal (including alloy) included in the metal film includes, for example, at least one selected from the group consisting of Mo, Au, Cu, Ag, Al, Ta and W.

The first conductive layer 11 may include an interlayer conductive film. The interlayer conductive film is provided between the oxide light-transmitting conductive film and the base body 10s, and between the oxide light-transmitting conductive film and the photoelectric conversion layer. The interlayer conductive film may be, for example, a dot shape, a line shape, or a mesh shape. The interlayer conductive film preferably includes, for example, at least one selected from the group consisting of metals, alloys, graphene, conductive nitrides and conductive oxides. The aperture ratio of the interlayer conductive film is preferably not less than 50%, for example. The interlayer conductive film includes, for example, at least one selected from the group consisting of Mo, Au, Cu, Ag, Al, Ta and W.

When the first conductive layer 11 includes the metal film, a thickness of the metal film is preferably not more than 5 nm from the viewpoint of permeability. When the first conductive layer 11 includes a line-shaped or mesh-shaped metal film, the thickness of the metal film may exceed 5 nm.

For example, the first conductive layer 11 may be formed by forming the oxide light-transmitting conductive film on the base body 10s. The oxide light-transmitting conductive film may be formed by, for example, sputtering. The first conductive layer 11 may be formed by forming a film including the metal on the base body 10s. The film including the metal may be patterned as needed. For example, a mesh-shaped metal or a line-shaped metal can be obtained.

The second counter conductive layer 12o may include the same material and the same configuration as the first counter conductive layer 11o. The second conductive layer 12 may include the same material and the same configuration as the first conductive layer 11.

Second Embodiment

A multi-junction solar cell according to a second embodiment includes the solar cell according to the first embodiment (for example, a solar cell 110 or a solar cell 111 or the like).

Figure 6:
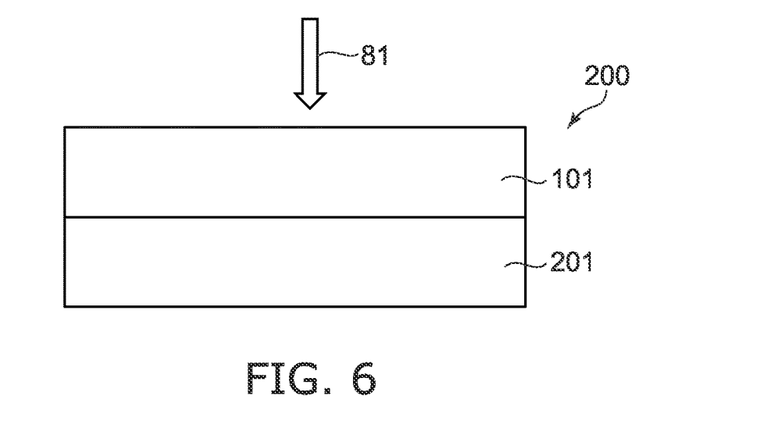
FIG. 6 is a schematic cross sectional view illustrating a multi-junction type solar cell according to a second embodiment.

FIG. 6 is a schematic cross sectional view illustrating a multi-junction type solar cell according to the second embodiment.

As shown in FIG. 6, a multi-junction type solar cell 200 according to the embodiment includes a first solar cell 101 and a second solar cell 201. The first solar cell 101 is the solar cell according to the first embodiment (for example, the solar cell 110 or the solar cell 111). The first solar cell 101 and the second solar cell 201 are stacked with each other. For example, light 81 passes through the first solar cell 101 and is incident on the second solar cell 201. In the multi-junction type solar cell 200, the number of stacked solar cells is not less than 2 and is arbitrary.

A band gap of the photoelectric conversion layer of the second solar cell 201 is smaller than a band gap of the photoelectric conversion layer of the solar cell 101. The band gap of the photoelectric conversion layer of the first solar cell 101 is, for example, not less than 2.10 eV. The band gap of the photoelectric conversion layer of the second solar cell 201 is, for example, not less than 1.0 eV and not more than 1.4 eV. The photoelectric conversion layer of the second solar cell 201 includes, for example, at least one of a compound semiconductor layer and crystalline silicon. The compound semiconductor layer includes, for example, at least one of a CIGS-based compound, a CIT-based compound, and a CdTe-based compound. The content ratio of In in the CIGS-based compounds is high.

The first solar cell 101 almost transmits light having an absorption band wavelength of the photoelectric conversion layer of the second solar cell 201. It is possible to suppress a decrease in conversion efficiency in the second solar cell 201. A highly efficient multi-junction type solar cell can be obtained.

Third Embodiment

A solar cell module according to a third embodiment includes the multi-junction type solar cell according to the second embodiment.

Figure 7:
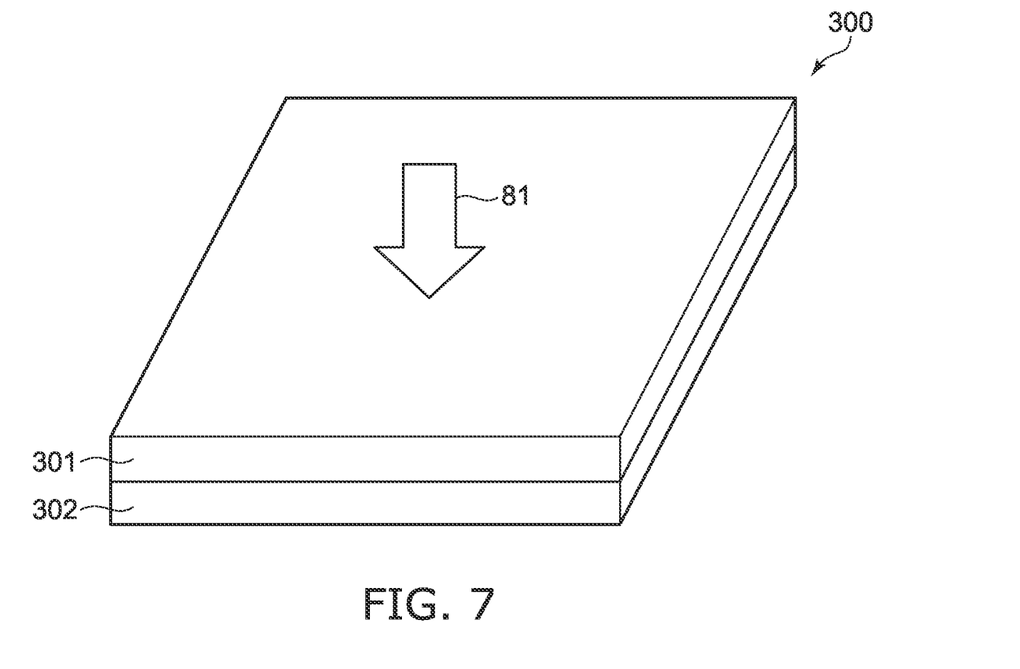
FIG. 7 is a schematic perspective view illustrating a solar cell module according to a third embodiment.

FIG. 7 is a schematic perspective view illustrating a solar cell module according to the third embodiment.

As shown in FIG. 7, a solar cell module 300 according to the embodiment includes a first solar cell module 301 and a second solar cell module 302. The first solar cell module 301 and the second solar cell module 302 are stacked with each other. The light that has passed through the first solar cell module 301 is incident on the second solar cell module 302. The first solar cell module 301 includes the solar cell according to the first embodiment (for example, the first solar cell 110 or the solar cell 111). The first solar cell module 301 includes, for example, the second solar cell 201.

Figure 8:
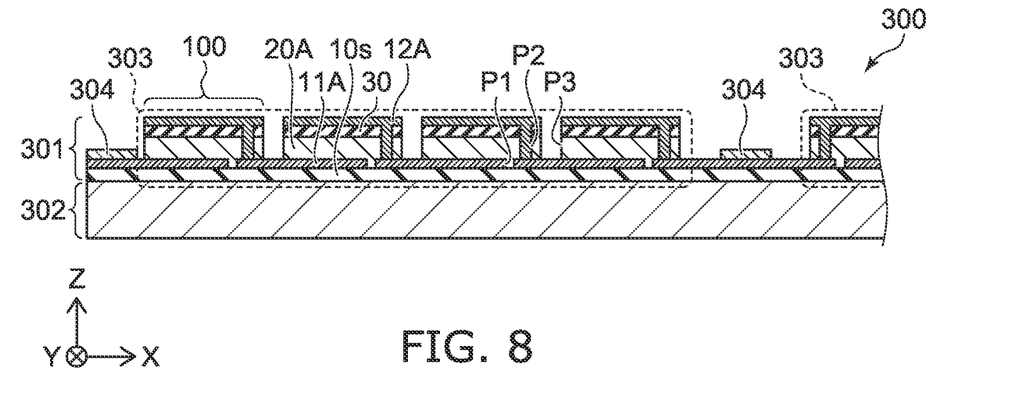
FIG. 8 is a schematic cross sectional view illustrating a solar cell module according to the third embodiment.

FIG. 8 is a schematic cross sectional view illustrating the solar cell module according to the third embodiment.

In FIG. 8, the structure of the first solar cell module 301 is shown in a simplified manner. In FIG. 8, the compound layer for electrical insulation and the like is omitted. In FIG. 8, the structure of the second solar cell module 302 is omitted. In the second solar cell module 302, the structure of the solar cell module may be appropriately applied depending on the photoelectric conversion layer of the solar cell used and the like.

As shown in FIG. 8, the solar cell module 300 includes multiple submodules 303. One of the multiple submodules 303 is shown surrounded by a broken line. The multiple submodules 303 are electrically connected in parallel or electrically in series with each other. One of the multiple submodules 303 includes multiple solar cells 100 (solar cell). The multiple solar cells 100 are connected in series. The multiple solar cells 100 are arranged along, for example, an X-Y plane.

The multiple solar cells 100 are separated by separation regions P1 to P3 (for example, a scribe region). In one of the multiple solar cells 100, there is a photoelectric conversion layer between the first electrode 11A and the second electrode 12A. One first electrode 11A of the multiple solar cells 100 is electrically connected to another second electrode 12A of the multiple solar cells 100. Another one of the multiple solar cells 100 is next to one of the multiple solar cells 100. The first electrode 11A is, for example, the first conductive layer 11 or the second conductive layer 12. The second electrode 12A is, for example, the first counter conductive layer 11o or the second counter conductive layer 12o. As shown in FIG. 8, a connection electrode 304 electrically connected with these electrodes may be provided. These electrodes may be electrically connected with the outside via the connection electrode 304. The connection electrode 304 is, for example, a terminal.

If the output voltage differs among multiple solar cell modules, a current may flow back to the solar cell module having a low voltage. This produces heat. For example, the output of the solar cell module is reduced.

In the embodiment, a solar cell suitable for each wavelength band may be used. Higher power generation efficiency can be obtained as compared with the case where a top cell solar cell and a bottom cell solar cell are used alone. For example, the overall output of the solar cell module will increase.

When the conversion efficiency of the entire solar cell module is high, the ratio of energy that becomes heat to the irradiated light energy can be reduced. For example, the temperature of the entire solar cell module can be suppressed. It is possible to suppress the decrease in efficiency due to the temperature rise.

Fourth Embodiment

The solar cell power generation system according to the fourth embodiment includes the solar cell module according to the third embodiment. The photovoltaic power generation system is used, for example, as a generator for generating power. For example, the photovoltaic power generation system uses a solar cell module to generate electricity. The photovoltaic power generation system may include, for example, a solar cell module and a power converter. The solar cell module generates electricity. The power converter converts the generated electricity into electric power. The photovoltaic power generation system may include, for example, at least one of a power storage part or a load. The power storage part stores the generated electricity. The load consumes power.

Figure 9:
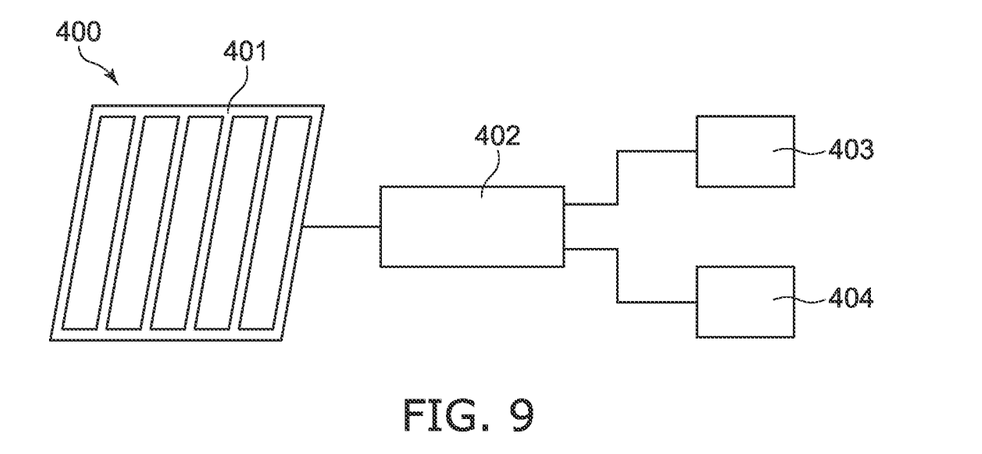
FIG. 9 is a schematic view illustrating a solar cell power generation system according to a fourth embodiment.

FIG. 9 is a schematic view illustrating the solar cell power generation system according to the fourth embodiment.

As shown in FIG. 9, a photovoltaic power generation system 400 includes a solar cell module 401 (for example, a solar cell module 300), a power conversion device 402, a storage battery 403, and a load 404. One of the storage battery 403 and the load 404 may be omitted. The load 404 may utilize the electric energy stored in the storage battery 403. The power conversion device 402 includes at least one of a circuit or an element. At least one of the circuit or the element performs power conversion. Power conversion includes at least one of transformation and DC/AC conversion. The configuration corresponding to the configuration of the generated voltage, the storage battery 403, and the load 404 may be applied to the power conversion device 402.

The solar cell module 401 (for example, the solar cell module 300) includes a sub-module (first solar cell module 301). The solar cells included in the sub-module (first solar cell module 301) generate electricity. The electric energy of power generation is converted by the power conversion device 402. The converted electric energy is stored in the storage battery 403. Alternatively, the converted electrical energy is consumed by the load 404. The solar cell module 401 may be provided with a solar tracking drive device that causes the solar cell module 401 to follow the movement of the sun. The solar cell module 401 may be provided with a condenser that collects sunlight. A device or the like for improving the power generation efficiency may be added to the solar cell module 401.

The photovoltaic power generation system 400 may be used for real estate such as a residence, a commercial facility, or a factory. The photovoltaic power generation system 400 may be used, for example, for a movable property such as a vehicle, an aircraft, or an electronic device.

An application example of the photovoltaic power generation system 400 will be described.

Figure 10:
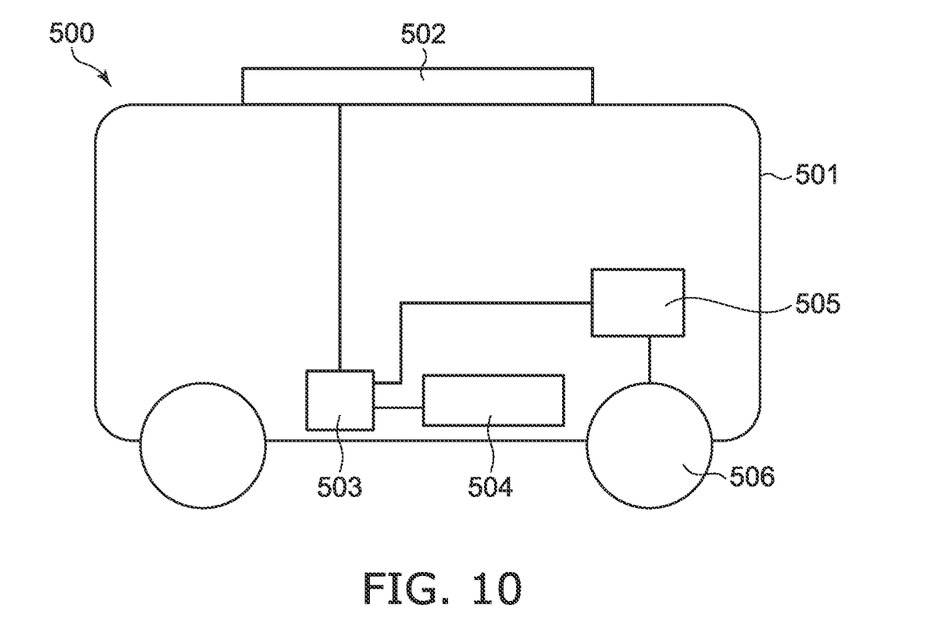
FIG. 10 is a schematic view showing a usage example of the solar cell power generation system according to the fourth embodiment.

FIG. 10 is a schematic diagram showing an application example of the solar cell power generation system according to the fourth embodiment.

As shown in FIG. 10, the solar cell power generation system is used in a vehicle 500. The vehicle 500 includes a vehicle body 501, a solar cell module 502, a power conversion device 503, a storage battery 504, a motor 505, and a wheel 506. The solar cell module 502 is provided on the upper part of the vehicle body 501. The electric power generated by the solar cell module 502 is converted by the power conversion device 503. The electric power is stored in the storage battery 504. Alternatively, the electric power is consumed by a load such as a motor 505. The wheel 506 is rotated by the motor 505 using the electric power supplied from the solar cell module 502 or the storage battery 504. As a result, the vehicle 500 moves. The solar cell module 502 may include a non-multi-junction type solar cell. The solar cell module 502 may be formed of only the first solar cell module including the light-transmitting solar cell 100. At least a part of the solar cell module 502 may be transparent. In this case, the solar cell module 502 may be provided as a window on a side surface of the vehicle body 501.

The embodiments may include the following configurations (e.g., technical proposals).

Configuration 1

A solar cell, comprising:
a first conductive layer;
a first counter conductive layer including a first conductive region, a direction from the first conductive layer to the first conductive region being along a first direction;
a first photoelectric conversion layer provided between the first conductive layer and the first conductive region;
a first compound layer including a first compound region provided between the first photoelectric conversion layer and the first conductive region;
a second conductive layer, a second direction from the first conductive layer to the second conductive layer crossing the first direction;
a second counter conductive layer including a second conductive region electrically connected with the first conductive layer, a direction from the second conductive layer to the second conductive region being along the first direction, a direction from the first conductive region to the second conductive region being along the second direction;
a second photoelectric conversion layer provided between the second conductive layer and the second conductive region; and
a second compound layer including a second compound region and a third compound region, the second compound region being provided between the second photoelectric conversion layer and the second conductive region, at least a part of the third compound region being between the first conductive layer and the second conductive layer.

Configuration 2

The solar cell according to Configuration 1, wherein
the second counter conductive layer further includes a third conductive region, and
the third conductive region electrically connects the first conductive layer and the second conductive region.

Configuration 3

The solar cell according to Configuration 2, wherein
at least a part of the third conductive region is between the first photoelectric conversion layer and the second photoelectric conversion layer in the second direction.

Configuration 4

The solar cell according to any one of Configurations 1 to 3, wherein
the second counter conductive layer further includes a fourth conductive region,
the second compound layer includes a fourth compound region,
the third compound region is between the fourth conductive region and a part of the second photoelectric conversion layer, and
the fourth compound region is between the fourth conductive region and another part of the second photoelectric conversion layer.

Configuration 5

The solar cell according to Configuration 4, wherein
the fourth conductive region is between the fourth compound region and the third compound region in the second direction.

Configuration 6

The solar cell according to Configuration 4 or 5, wherein
at least a part of the fourth compound region is between the first conductive layer and the second conductive layer.

Configuration 7

The solar cell according to any one of Configurations 4 to 6, wherein
at least a part of the fourth conductive region is between the first conductive layer and the second conductive layer.

Configuration 8

The solar cell according to any one of Configurations 4 to 7, wherein
the second counter conductive layer further includes a fifth conductive region,
the fifth conductive region is between the fourth compound region and the fourth conductive region in the second direction, and
a direction from the fifth conductive region to the fourth conductive region is along the second direction.

Configuration 9

The solar cell according to Configuration 8, wherein
the second counter conductive layer further includes a sixth conductive region, and
the sixth conductive region electrically connects the fifth conductive region and the fourth conductive region.

Configuration 10

The solar cell according to any one of Configurations 1 to 9, wherein
at least one of the first photoelectric conversion layer or the second photoelectric conversion layer includes copper and oxygen.

Configuration 11

The solar cell according to any one of Configurations 1 to 9, wherein
at least one of the first photoelectric conversion layer or the second photoelectric conversion layer includes $Cu_2O$.

Configuration 12

The solar cell according to any one of Configurations 1 to 11, wherein
at least one of the first compound layer or the second compound layer includes an oxide including at least one selected from the group consisting of Ga, Al, B, In, Ti, Zn, Hf, Zr, Sn, Si and Ge.

Configuration 13

The solar cell according to any one of Configurations 1 to 12, wherein
conductivity of the first compound layer is lower than conductivity of the first photoelectric conversion layer, and
conductivity of the second compound layer is lower than conductivity of the second photoelectric conversion layer.

Configuration 14

The solar cell according to any one of Configurations 1 to 13, wherein
at least one of the first compound layer or the second compound layer is of an n-type.

Configuration 15

The solar cell according to any one of Configurations 1 to 14, further comprising a base body,
the base body including a first surface including a first base body region and a second base body region,
the first conductive layer being between the first base body region and the first conductive region in the first direction, and
the second conductive layer being between the second base body region and the second conductive region in the first direction.

Configuration 16

The solar cell according to any one of Configurations 1 to 15, wherein
a length of the third compound region in the second direction is shorter than a length of the second photoelectric conversion layer in the first direction.

Configuration 17

The solar cell according to Configuration 4, wherein
a length of the fourth conductive region in the second direction is shorter than a length of the second photoelectric conversion layer in the first direction.

Configuration 18

A multi-junction type solar cell, comprising:
the solar cell according to any one of Configurations 1 to 17.

Configuration 19

A solar cell module, comprising:
the multi-junction type solar cell according to Configuration 18.

Configuration 20

A solar cell power generation system, comprising:
the solar cell module according to Configuration 19.

According to the embodiments, a solar cell, a multi-junction type solar cell, a solar cell module, and a solar cell power generation system are provided, in which the efficiency can be improved.

Hereinabove, exemplary embodiments of the invention are described with reference to specific examples. However, the embodiments of the invention are not limited to these specific examples. For example, one skilled in the art may similarly practice the invention by appropriately selecting specific configurations of components included in solar cells such as conductive layers, photoelectric conversion layers, compound layers, base bodies, etc., from known art. Such practice is included in the scope of the invention to the extent that similar effects thereto are obtained.

Further, any two or more components of the specific examples may be combined within the extent of technical feasibility and are included in the scope of the invention to the extent that the purport of the invention is included.

Moreover, all solar cells, multi-junction type solar cells, solar cell modules, and solar cell power generation systems practicable by an appropriate design modification by one skilled in the art based on the solar cells, the multi-junction type solar cells, the solar cell modules, and the solar cell power generation systems described above as embodiments of the invention also are within the scope of the invention to the extent that the purport of the invention is included.

Various other variations and modifications can be conceived by those skilled in the art within the spirit of the invention, and it is understood that such variations and modifications are also encompassed within the scope of the invention.

While certain embodiments have been described, these embodiments have been presented by way of example only, and are not intended to limit the scope of the inventions. Indeed, the novel embodiments described herein may be embodied in a variety of other forms; furthermore, various omissions, substitutions and changes in the form of the embodiments described herein may be made without departing from the spirit of the inventions. The accompanying claims and their equivalents are intended to cover such forms or modifications as would fall within the scope and spirit of the invention.

What is claimed is:
1. A solar cell, comprising:
a substrate; and
a first cell and a second cell on the substrate,
the first cell comprising
a first conductive layer which is a conductive film,
a first photoelectric conversion layer which is a photoelectric conversion film,
a first compound layer which is a compound film, and
a first opposing conductive layer which is a conductive film,
the second cell comprising
a second conductive layer which is a conductive film,
a second photoelectric conversion layer which is a photoelectric conversion film,
a second compound layer which is a compound film, and
a second opposing conductive layer which is a conductive film electrically connected to the first conductive layer,
wherein
a groove is provided between a part of the second photoelectric conversion layer and another part of the second photoelectric conversion layer,
the first photoelectric conversion layer and the other part of the second photoelectric conversion layer are on the first conductive layer,
the groove has a surface on a side of the part of the second photoelectric conversion layer, a surface on a side of the other part of the second photoelectric conversion layer, and a surface on a side of the substrate,
a portion of the second compound layer and a portion of the second opposing conductive layer are formed in this order on the surface on the side of the part of the second photoelectric conversion layer,
at least a portion of the part of the second compound layer is between the first conductive layer and the second conductive layer,
another portion of the second opposing conductive layer on the surface on the side of the other part of the second photoelectric conversion layer and the part of the second opposing conductive layer are separated,
a further portion of the second opposing conductive layer on the surface on the substrate side is between the other part of the second opposing conductive layer and the part of the second opposing conductive layer, and
the further portion of the second opposing conductive layer electrically connects the other part of the second opposing conductive layer and the part of the second opposing conductive layer.
2. The solar cell according to claim 1, wherein
at least a portion of the part of the second opposing conductive layer is between the first conductive layer and the second conductive layer.
3. The solar cell according to claim 1, wherein
at least one of the first photoelectric conversion layer and the second photoelectric conversion layer contains copper and oxygen.

4. The solar cell according to any one of claim 1, wherein at least one of the first photoelectric conversion layer and the second photoelectric conversion layer contains $Cu_2O$.

5. The solar cell according to any one of claim 1, wherein at least one of the first compound layer and the second compound layer contains an oxide containing at least one selected from the group consisting of Ga, Al, B, In, Ti, Zn, Hf, Zr, Sn, Si, and Ge.

6. The solar cell according to any one of claim 1, wherein
a conductivity of the first compound layer is lower than a conductivity of the first photoelectric conversion layer, and
a conductivity of the second compound layer is lower than a conductivity of the second photoelectric conversion layer.

7. The solar cell according to any one of claim 1, wherein at least one of the first compound layer and the second compound layer is of n-type.

8. The solar cell according to any one of claim 1, wherein a length of the portion of the second compound layer in a direction from the first conductive layer to the second conductive layer is shorter than a length of the portion of the second photoelectric conversion layer in a direction from the first conductive layer to the first opposing conductive layer.

9. The solar cell according to any one of claim 1, wherein a length of the portion of the second opposing conductive layer in the direction from the first conductive layer to the second conductive layer is shorter than a length of the portion of the second photoelectric conversion layer in the direction from the first conductive layer to the first opposing conductive layer.

10. A multi-junction type solar cell, comprising the solar cell according to claim 1.

11. A solar cell module, comprising the multi-junction type solar cell according to claim 10.

12. A solar cell power generation system, comprising the solar cell module according to claim 11.

* * * * *